「(12) United States Patent
Wu et al.

(10) Patent No.: US 9,123,772 B2
(45) Date of Patent: Sep. 1, 2015

(54) FINFET FABRICATION METHOD

(71) Applicant: GLOBALFOUNDARIES Inc, Grand Cayman, KY (US)

(72) Inventors: Xusheng Wu, Hopewell Junction, NY (US); Wanxun He, Mechanicville, NY (US); Hongliang Shen, Ballston Lake, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 59 days.

(21) Appl. No.: 14/044,533

(22) Filed: Oct. 2, 2013

(65) Prior Publication Data
US 2015/0093878 A1 Apr. 2, 2015

(51) Int. Cl.
*H01L 21/00* (2006.01)
*H01L 21/762* (2006.01)
*H01L 29/66* (2006.01)
*H01L 29/78* (2006.01)
*H01L 27/088* (2006.01)

(52) U.S. Cl.
CPC ...... *H01L 21/76224* (2013.01); *H01L 27/0886* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 6,872,647 B1 * | 3/2005 | Yu et al. ............... 438/585 |
| 7,476,578 B1 | 1/2009 | Cheng et al. |
| 8,368,146 B2 | 2/2013 | Basker et al. |
| 2005/0161739 A1 * | 7/2005 | Anderson et al. ......... 257/347 |
| 2011/0101455 A1 | 5/2011 | Basker et al. |
| 2014/0099792 A1 * | 4/2014 | Bergendahl et al. ....... 438/696 |
| 2014/0264717 A1 * | 9/2014 | Shieh et al. .............. 257/499 |
| 2014/0273464 A1 * | 9/2014 | Shieh et al. .............. 438/700 |

* cited by examiner

*Primary Examiner* — Charles Garber
*Assistant Examiner* — Evren Seven
(74) *Attorney, Agent, or Firm* — Williams Morgan, P.C.

(57) ABSTRACT

Embodiments of the present invention provide an improved method for fabrication of fin field effect transistors (finFETs). Sacrificial regions are formed on a semiconductor substrate. Spacers are formed adjacent to two sides of the sacrificial regions. Fins are formed based on the spacers. One set of spacers is treated as dummy spacers, and is removed prior to fin formation, leaving the other set of spacers to be used for forming fins on the final semiconductor structure. All the fins on the final semiconductor structure are formed from spacers on one side of the sacrificial material. This reduces variation in width of the fins.

20 Claims, 7 Drawing Sheets

US 9,123,772 B2

FINFET FABRICATION METHOD

FIELD OF THE INVENTION

The present invention relates generally to semiconductor fabrication, and more particularly to improved methods for finFET fabrication.

BACKGROUND

As integrated circuits continue to scale downward in size, the finFET (fin field effect transistor) is becoming an attractive device for use with smaller nodes (e.g., the 22 nm node and beyond). In a finFET, the channel is formed by a semiconductor fin and a gate electrode is located on at least two sides of the fin. A finFET device generally has faster switching times, equivalent or higher current density, and much improved short channel control than planar CMOS technology utilizing similar critical dimensions. FinFETs have applications in a variety of integrated circuits. In some cases, multiple fins may be merged together as part of a single transistor. In other cases, such as with static random access memory (SRAM), a transistor may comprise a single fin.

SUMMARY

In a first aspect, embodiments of the present invention provide a method of forming a semiconductor structure, comprising: forming a nitride liner on a semiconductor substrate; forming a plurality of sacrificial material regions on the nitride liner; forming a first set of spacers on a first side of each of the sacrificial material regions and a second set of spacers on a second side of each of the sacrificial material regions; removing the plurality of sacrificial material regions; removing the second set of spacers while preserving the first set of spacers; and forming fins on the semiconductor substrate.

In a second aspect, embodiments of the present invention provide a method of forming a circuit comprising a plurality of finFET devices, wherein each finFET device comprises a single fin, and wherein each fin of the plurality of finFET devices is formed by: forming a nitride liner on a semiconductor substrate; forming a plurality of sacrificial material regions on the nitride liner; forming a first set of spacers on a first side of each of the sacrificial material regions and a second set of spacers on a second side of each of the sacrificial material regions; removing the plurality of sacrificial material regions; removing the second set of spacers while preserving the first set of spacers; and forming fins on the semiconductor substrate.

In a third aspect, embodiments of the present invention provide a method of forming a semiconductor structure, comprising: forming a nitride liner on a semiconductor substrate; forming a plurality of sacrificial material regions on the nitride liner, wherein a pitch between adjacent sacrificial material regions ranges from about 50 nanometers to about 90 nanometers; forming a first set of spacers on a first side of each of the sacrificial material regions and a second set of spacers on a second side of each of the sacrificial material regions; removing the plurality of sacrificial material regions; removing the second set of spacers while preserving the first set of spacers; and forming fins on the semiconductor substrate.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Often, similar elements may be referred to by similar numbers in various figures (FIGS) of the drawing, in which case typically the last two significant digits may be the same, the most significant digit being the number of the drawing figure (FIG.).

Figure 1:
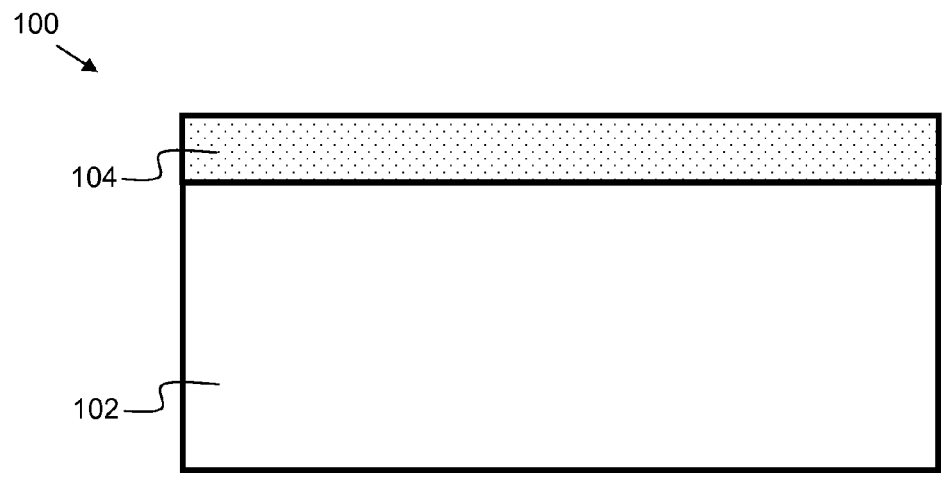
Figure 2:
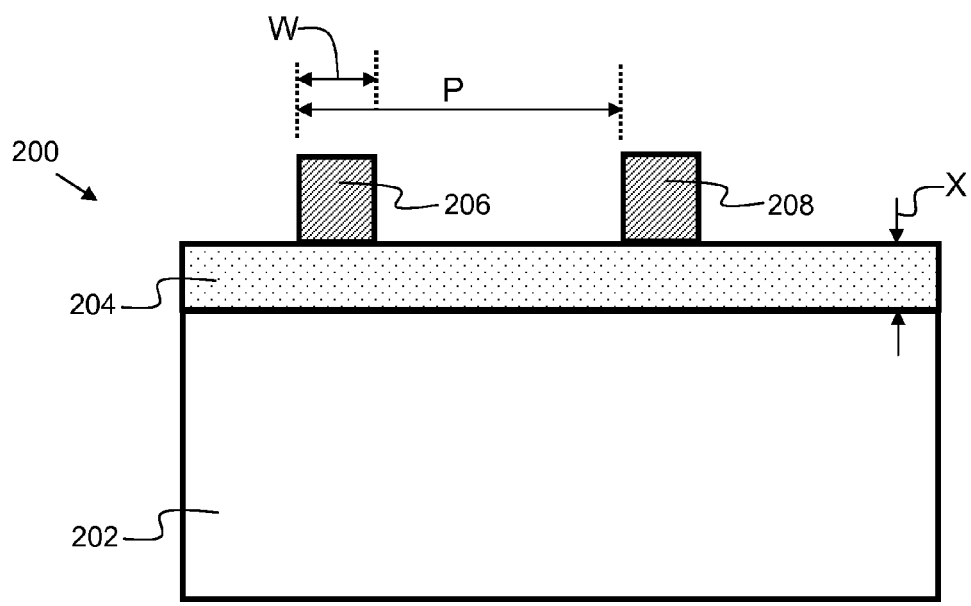
Figure 3:
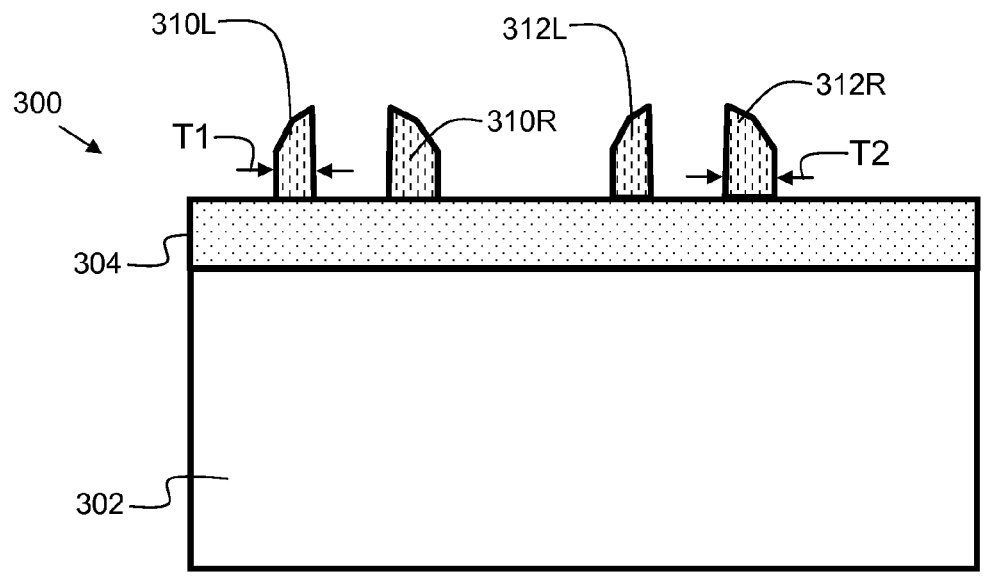
Figure 4:
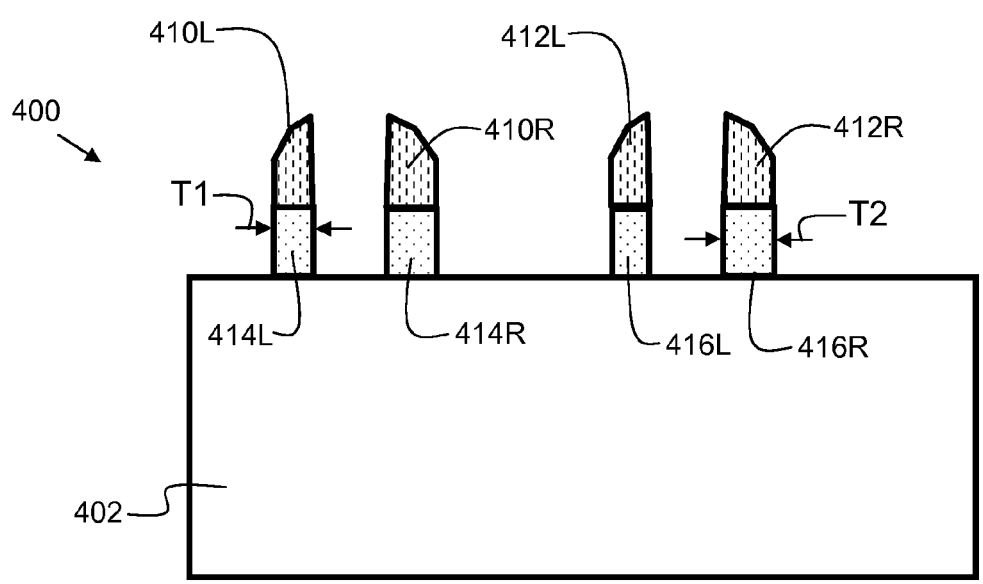
Figure 5:
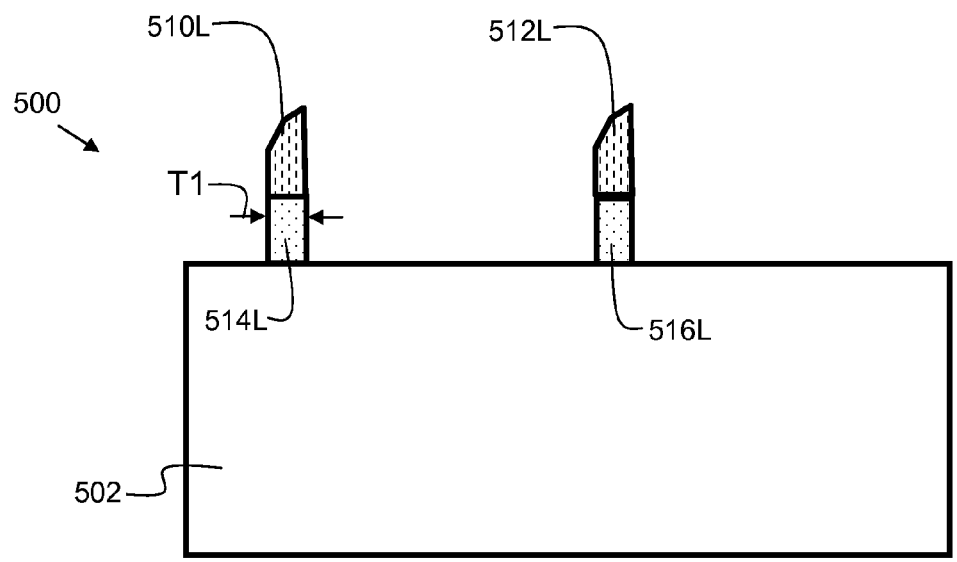
Figure 6:
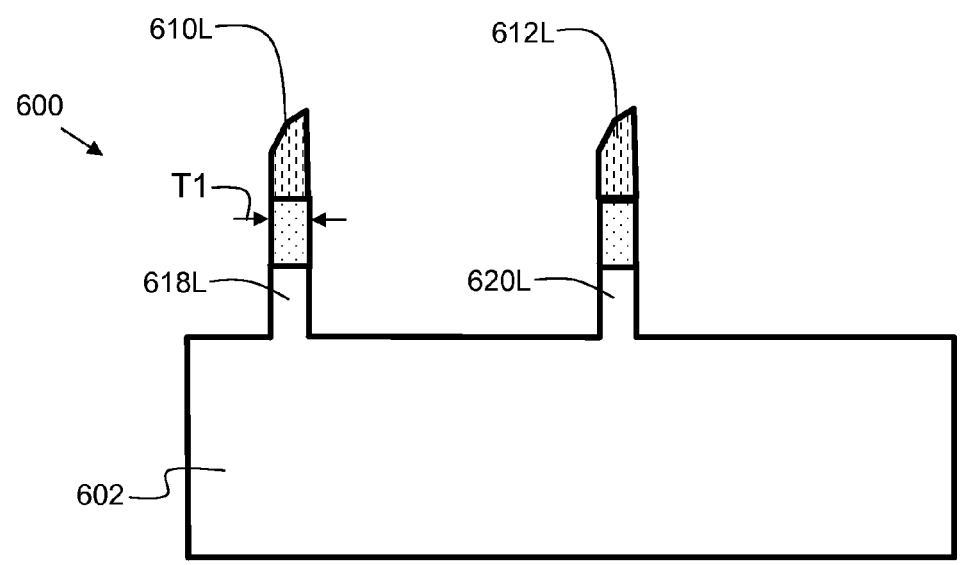
Figure 7:
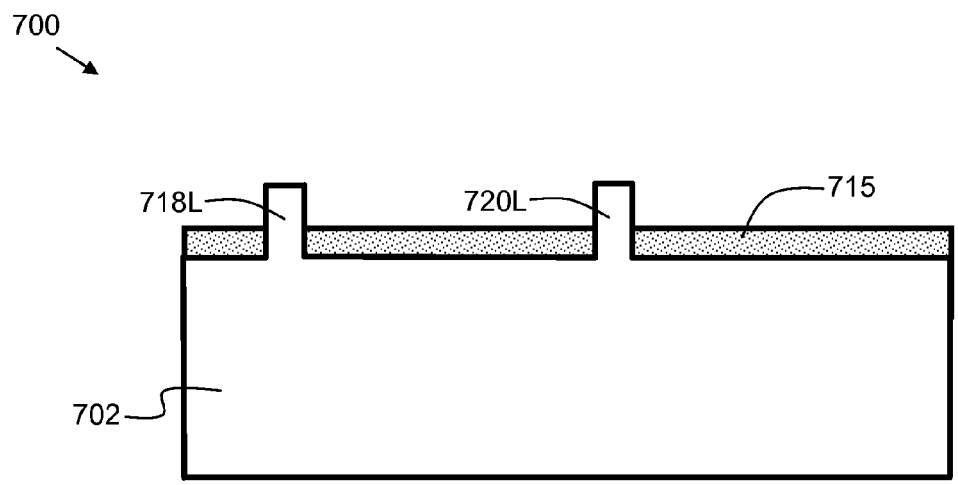
Figure 8:
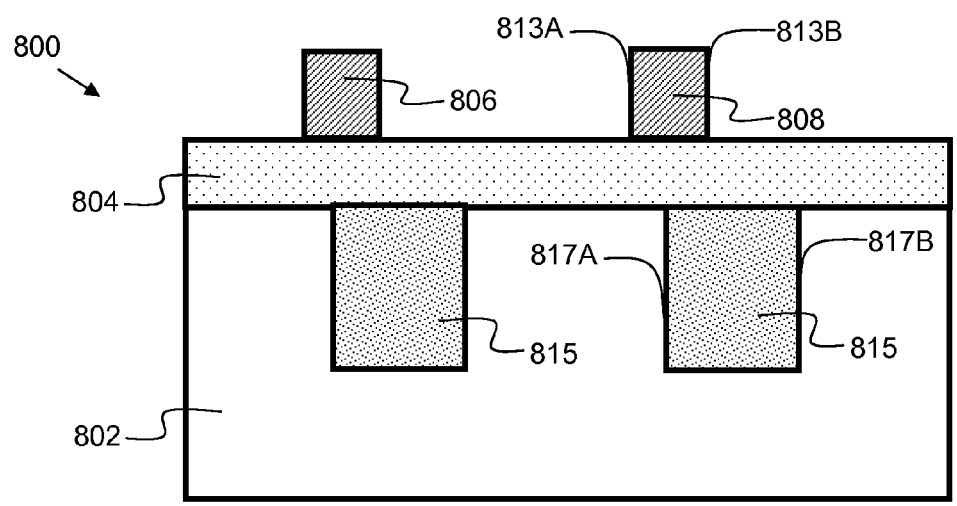
Figure 9:
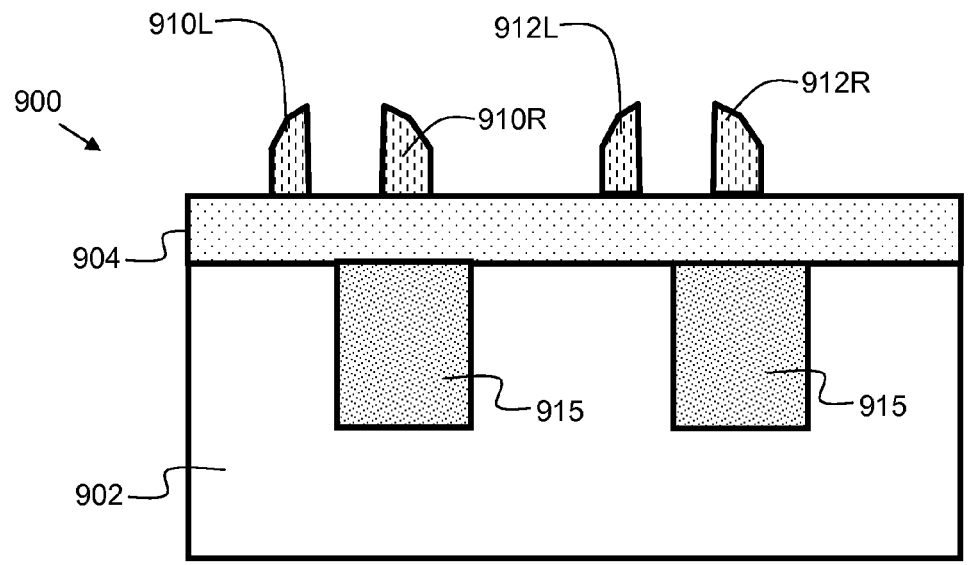
Figure 10:
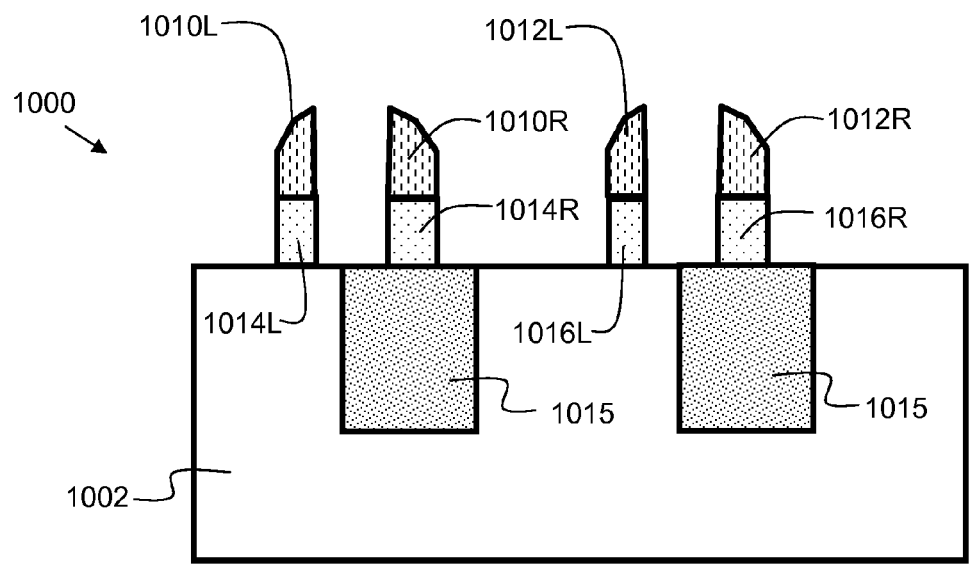
Figure 11:
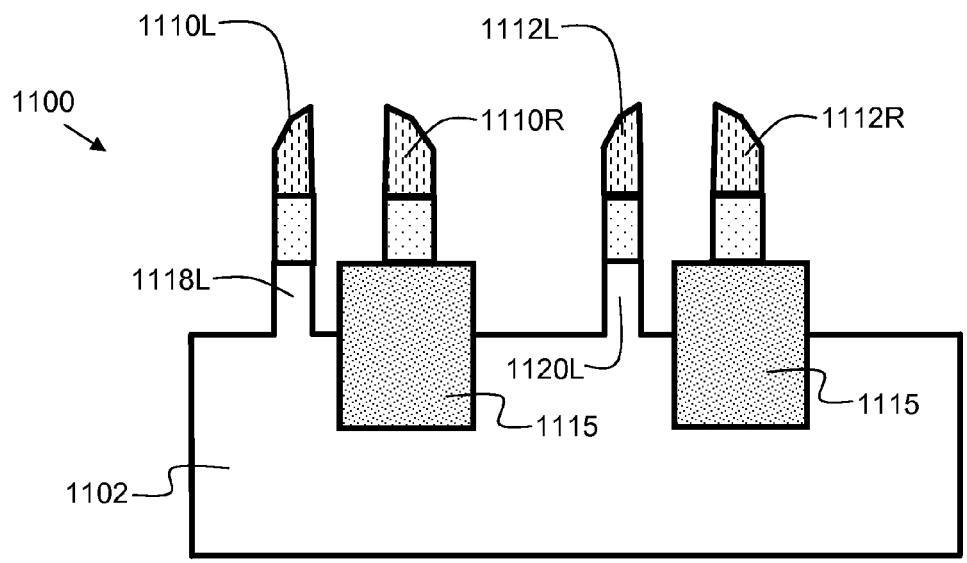
Figure 12:
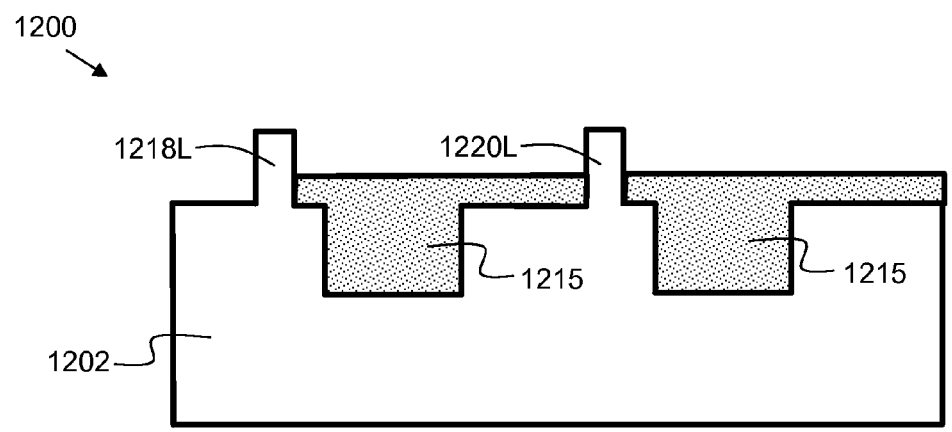
Figure 13:
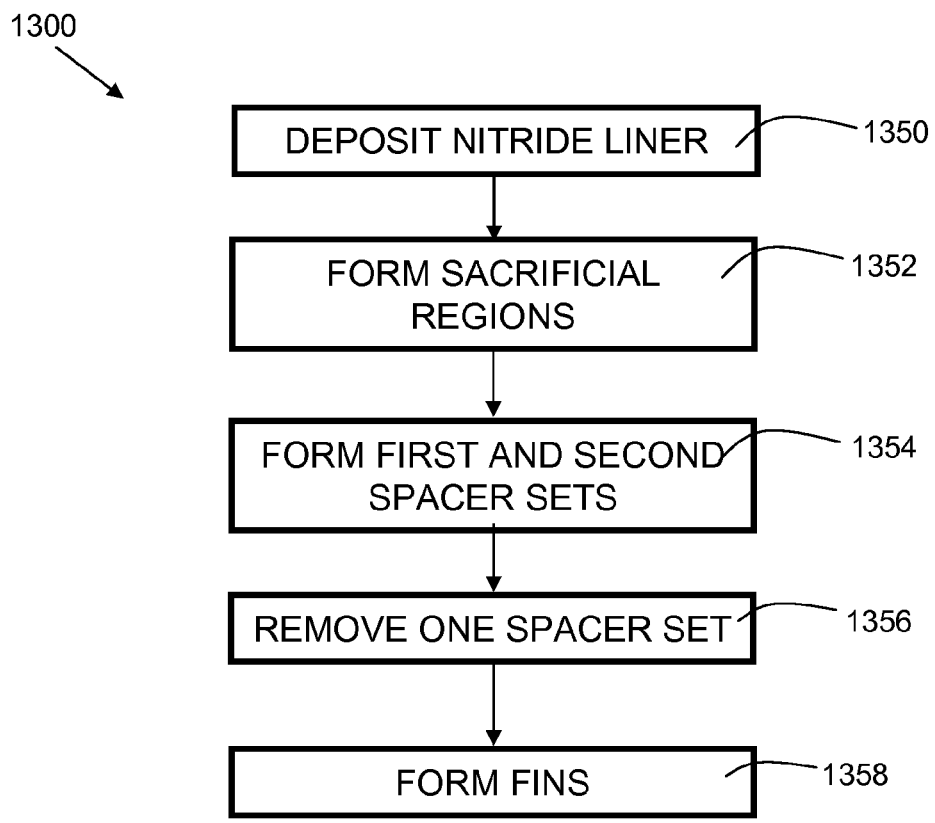

Features of this invention will be more readily understood from the following detailed description of the various aspects of the invention taken in conjunction with the accompanying drawings in which:

FIG. 1 is a semiconductor structure at a starting point for illustrative embodiments;

FIG. 2 is a semiconductor structure after a subsequent process step of forming sacrificial material regions, in accordance with illustrative embodiments;

FIG. 3 is a semiconductor structure after subsequent process steps of forming left and right spacers and removing the sacrificial material, in accordance with illustrative embodiments;

FIG. 4 is a semiconductor structure after a subsequent process step of removing the underlying nitride liner, in accordance with illustrative embodiments;

FIG. 5 is a semiconductor structure after a subsequent process step of dummy spacer removal;

FIG. 6 is a semiconductor structure after a subsequent process step of fin formation;

FIG. 7 is a semiconductor structure after subsequent process steps of shallow trench isolation refilling and recessing;

FIG. 8 is a semiconductor structure at a starting point for alternative illustrative embodiments utilizing shallow trench isolation;

FIG. 9 is a semiconductor structure after subsequent process steps of forming left and right spacers and removing the sacrificial material, in accordance with alternative illustrative embodiments;

FIG. 10 is a semiconductor structure after a subsequent process step of removing the underlying nitride liner, in accordance with alternative illustrative embodiments;

FIG. 11 is a semiconductor structure after a subsequent process step of forming fins, in accordance with alternative illustrative embodiments;

FIG. 12 is a semiconductor structure after subsequent process steps of removing intermediate layers and refilling the shallow trench isolation, in accordance with alternative illustrative embodiments; and FIG. 13 is a flowchart indicating process steps for embodiments of the present invention.

DETAILED DESCRIPTION

Embodiments of the present invention provide an improved method for fabrication of fin field effect transistors (finFETs). Sacrificial regions are formed on a semiconductor substrate. Spacers are formed adjacent to two sides of the sacrificial regions. Fins are formed based on the spacers. One set of spacers is treated as dummy spacers, and is removed prior to fin formation, leaving the other set of spacers to be used for forming fins on the final semiconductor structure. All the fins on the final semiconductor structure are formed from spacers on one side of the sacrificial material. This reduces variation in width of the fins, and improves product reliability and yield for devices that employ single-fin finFETs, such as SRAM integrated circuits (ICs), latches, and ring oscillators.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 is a semiconductor structure 100 at a starting point for illustrative embodiments. Semiconductor structure 100 includes a semiconductor substrate 102, which may be a silicon substrate. Substrate 102 may be a bulk substrate, such as in the form of a wafer. However, embodiments of the present invention may also be used with silicon-on-insulator (SOI) technology. Disposed on substrate 102 is a pad nitride liner 104. In embodiments, pad nitride liner 104 may be comprised of silicon nitride. In some embodiments, liner 104 may have a thickness X ranging from about 10 nanometers to about 100 nanometers. In embodiments, liner 104 may be deposited via a chemical vapor deposition (CVD) process.

FIG. 2 is a semiconductor structure 200 after a subsequent process step of forming sacrificial material regions 206, in accordance with illustrative embodiments. In embodiments, sacrificial material regions 206 may be comprised of amorphous silicon and may be deposited via industry-standard patterning and deposition techniques. In other embodiments, sacrificial material regions 206 may comprise an oxide, such as silicon oxide. As stated previously, similar elements may be referred to by similar numbers in various figures (FIGS) of the drawing, in which case typically the last two significant digits may be the same. For example, substrate 202 of FIG. 2 is similar to substrate 102 of FIG. 1. In some embodiments, the pitch P between adjacent sacrificial material regions 206 and 208 ranges from about 50 nanometers to about 90 nanometers. In some embodiments, the width W of a sacrificial material region (206, 208) may range from about 15 nanometers to about 30 nanometers.

FIG. 3 is a semiconductor structure 300 after a subsequent process step of forming left and right spacers, in accordance with illustrative embodiments. The spacers 310L, 310R, 312L, and 312R are formed in a single deposition process. The sacrificial material regions (206 of FIG. 2) are then removed with an etch process. In some embodiments, a reactive ion etch (RIE) process may be used for removal of the sacrificial material regions. The sacrificial material region 206 should preferably have high selectivity to the material used for spacers 310L, 310R, 312L, and 312R. In some embodiments, the spacers 310L, 310R, 312L, and 312R may be comprised of a nitride, such as silicon nitride. In some embodiments, the spacers 310L, 310R, 312L, and 312R may be comprised of an oxide, such as a silicon oxide. The material used for the spacers 310L, 310R, 312L, and 312R is preferably highly selectable to the sacrificial material regions (206 of FIG. 2).

In an ideal case, the width of spacer 310L would be the same as the width of spacer 310R. However, in practice, this is rarely the case. In practice, there is variation in thickness between the left and right side spacers due to variations in deposition and etch processes used in forming the spacers. For example, the left spacers 310L and 312L have a thickness T1, and the right spacers 310R and 312R have a thickness T2, where T1 is not equal to T2. Spacers formed on the same side are normally substantially equal to each other. For example, right spacers are normally substantially equal to other right spacers, and left spacers are normally substantially equal to other left spacers, due to the nature of etching and deposition processes. When fins are formed based on both sets of spacers, the difference between thickness T1 and thickness T2 could cause variation in fin width. For single-fin finFET applications, such as SRAM, the variation in fin width could have adverse effects on yield and device performance. Embodiments of the present invention mitigate this problem by utilizing fins from only one side in the final semiconductor integrated circuit. Fins from the other side are removed prior to completion of the integrated circuit. In this way, the mismatch between thickness T1 and thickness T2 does not affect the fin width in the final semiconductor integrated circuit. For SRAMs and other applications utilizing single-fin finFETs, including, but not limited to, latches, ring oscillators, and logic gates, embodiments of the present invention can significantly improve product yield and device performance.

FIG. 4 is a semiconductor structure 400 after a subsequent process step of removing most of the underlying nitride liner. A portion of the nitride liner remains under the spacers. The nitride liner portions 414L, 414R, 416L, and 416R are also subject to the variations in thickness between T1 and T2.

FIG. 5 is a semiconductor structure 500 after a subsequent process step of dummy spacer removal. In this example, the right spacers (410R and 412R of FIG. 4) have been removed. The removal of the dummy spacers may be accomplished via industry standard lithographic and etching techniques. The spacers 510L and 512L are from the left set of spacers, and will be used to form the fins. In embodiments of the present invention, one of the sets of spacers is treated as a set of dummy spacers that will not be used to form fins. The other set of spacers is treated as a set of functional spacers that will be used to form fins on the completed integrated circuit.

FIG. 6 is a semiconductor structure 600 after a subsequent process step of fin formation. An anisotropic etch is performed, resulting in the formation of fins 618L and 620L underneath the functional spacers 610L and 612L. In this example, the left fins 618L and 620L are formed based on spacers 610L and 612L respectively. However, other embodiments may utilize the right side spacers as functional spacers, and utilize the left side spacers as dummy spacers.

FIG. 7 is a semiconductor structure 700 after subsequent process steps forming shallow trench isolation (STI) regions 715. In embodiments, the STI regions 715 may be comprised of an oxide, such as silicon oxide. The STI regions 715 may be formed by depositing oxide via a chemical vapor deposition (CVD) process, followed by a recess process to place the top of the STI regions at a desired level.

FIG. 8 is a semiconductor structure 800 at a starting point for alternative illustrative embodiments utilizing shallow trench isolation (STI). In this embodiment, the sacrificial material regions 806 and 808 are formed in an off-center alignment with corresponding shallow trench isolation regions 815, such that, for example, left edge 813A of the sacrificial material region 808 is located to the left of the left edge 817A of shallow trench isolation region 815, and right edge 813B of sacrificial material region 808 is located to the right of left edge 817A of shallow trench isolation region 815, and is also located to the left of right edge 817B of shallow trench isolation region 815. Shallow trench isolation regions 815 may be comprised of silicon oxide or other suitable insulating material.

FIG. 9 is a semiconductor structure 900 after subsequent process steps of forming left and right spacers and removing the sacrificial material, in accordance with alternative illustrative embodiments. Left spacers 910L and 912L are formed above the semiconductor substrate 902, and are used as functional spacers in this example. Right spacers 910R and 912R are formed above the shallow trench isolation regions 915. The right spacers represent "dummy spacers" that are not used to form active fins, while the left spacers are functional spacers, and thus are used to form active fins.

FIG. 10 is a semiconductor structure 1000 after a subsequent process step of removing the underlying nitride liner, in accordance with alternative illustrative embodiments. Left nitride portions 1014L and 1016L are formed over the semiconductor substrate 1002, while right nitride portions 1014R and 1016R are formed over shallow trench isolation regions 1015.

FIG. 11 is a semiconductor structure 1100 after a subsequent process step of forming fins, in accordance with alternative illustrative embodiments. Fins 1118L and 1120L are formed from semiconductor substrate 1002, and are part of the final integrated circuit. No fins are formed under dummy spacers 1110R and 1112R, as those spacers are formed above STI regions 1115.

FIG. 12 is a semiconductor structure after subsequent process steps of removing intermediate layers and refilling the shallow trench isolation. Functional and dummy spacers (e.g., 1110R, 1110L, 1112R, and 1112L from FIG. 11) are removed. In this embodiment, the material underneath the dummy spacers is comprised of shallow trench isolation material, such as silicon oxide, and may therefore be removed by a selective etch process.

FIG. 13 is a flowchart 1300 indicating process steps for embodiments of the present invention. In process step 1350, a nitride liner is deposited on a semiconductor substrate. In process step 1352, sacrificial material regions are formed. In process step 1354, functional and dummy spacers are formed adjacent to the sacrificial material regions, and the sacrificial material regions are then removed. In process step 1356, the dummy spacers (from either the left or right side) are removed. In process step 1358, the fins are formed, based on the functional spacers. All the fins in the remaining set are from one side. That is, all the fins are formed either from all left-side spacers or all right-side spacers. By having all the fins formed from the spacers of one side, thickness mismatch between the two sides is eliminated in the fins, improving product yield and device performance.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
   forming a nitride liner on a semiconductor substrate;
   forming a plurality of sacrificial material regions on the nitride liner;
   forming a first set of spacers on a first side of each of the sacrificial material regions and a second set of spacers on a second side of each of the sacrificial material regions;
   removing the plurality of sacrificial material regions;
   removing each of the second set of spacers while preserving the first set of spacers; and
   forming fins on the semiconductor substrate.

2. The method of claim 1, wherein forming a plurality of sacrificial material regions on the nitride liner comprises forming a plurality of amorphous silicon regions.

3. The method of claim 1, wherein forming a first set of spacers and a second set of spacers comprises depositing silicon nitride.

4. The method of claim 1, wherein forming a plurality of sacrificial material regions on the nitride liner comprises forming a plurality of silicon oxide regions.

5. The method of claim 1, further comprising:
   forming a plurality of shallow trench isolation regions in the semiconductor substrate; and
   wherein forming a plurality of sacrificial material regions on the nitride liner comprises forming each sacrificial material region in an off-center alignment with a corresponding shallow trench isolation region.

6. The method of claim 1, wherein forming a nitride liner comprises forming a nitride liner having a thickness ranging from about 10 nanometers to about 100 nanometers.

7. The method of claim 1, wherein forming a nitride liner comprises depositing a nitride liner via a chemical vapor deposition process.

8. A method of forming a circuit comprising a plurality of finFET devices, wherein each finFET device comprises a single fin, and wherein each fin of the plurality of finFET devices is formed by:
   forming a nitride liner on a semiconductor substrate;
   forming a plurality of sacrificial material regions on the nitride liner;
   forming a first set of spacers on a first side of each of the sacrificial material regions and a second set of spacers on a second side of each of the sacrificial material regions;
   removing the plurality of sacrificial material regions;
   removing each of the second set of spacers while preserving the first set of spacers, and forming fins on the semiconductor substrate.

9. The method of claim 8, wherein forming a plurality of sacrificial material regions on the nitride liner comprises forming a plurality of amorphous silicon regions.

10. The method of claim 8, wherein forming a first set of spacers and a second set of spacers comprises depositing silicon nitride.

11. The method of claim 8, wherein forming a plurality of sacrificial material regions on the nitride liner comprises forming a plurality of silicon oxide regions.

12. The method of claim 8, wherein forming a nitride liner comprises forming a silicon nitride liner.

13. The method of claim 8, further comprising:
    forming a plurality of shallow trench isolation regions in the semiconductor substrate; and
    wherein forming a plurality of sacrificial material regions on the nitride liner comprises forming each sacrificial material region in an off-center alignment with a corresponding shallow trench isolation region.

14. The method of claim 8, wherein forming a nitride liner comprises forming a nitride liner having a thickness ranging from about 10 nanometers to about 100 nanometers.

15. The method of claim 8, wherein forming a nitride liner comprises depositing a nitride liner via a chemical vapor deposition process.

16. A method of forming a semiconductor structure, comprising:
    forming a nitride liner on a semiconductor substrate;
    forming a plurality of sacrificial material regions on the nitride liner;
    wherein a pitch between adjacent sacrificial material regions ranges from about 50 nanometers to about 90 nanometers;
    forming a first set of spacers on a first side of each of the sacrificial material regions and a second set of spacers on a second side of each of the sacrificial material regions;
    removing the plurality of sacrificial material regions;
    removing each of the second set of spacers while preserving the first set of spacers; and
    forming fins on the semiconductor substrate.

17. The method of claim 16, wherein forming a plurality of sacrificial material regions comprises forming sacrificial material regions having a width ranging from about 15 nanometers to about 30 nanometers.

18. The method of claim 16, wherein forming a plurality of sacrificial material regions on the nitride liner comprises forming a plurality of amorphous silicon regions.

19. The method of claim 16, wherein forming a nitride liner comprises forming a silicon nitride liner.

20. The method of claim 16, further comprising:
    forming a plurality of shallow trench isolation regions in the semiconductor substrate; and
    wherein forming a plurality of sacrificial material regions on the nitride liner comprises forming each sacrificial material region in an off-center alignment with a corresponding shallow trench isolation region.

* * * * *